United States Patent [19]

Carlach

[11] Patent Number: 4,696,020
[45] Date of Patent: Sep. 22, 1987

[54] DIGITAL CIRCUIT FOR FREQUENCY OR PULSE RATE DIVISION

[75] Inventor: Jean-Claude Carlach, Rennes, France

[73] Assignees: Etat Francais represent par le Secretariat d'Etat aux Postes et Telecommunications (Centre National d'Etudes des Telecommuncations), Issy les Moulineaux; Etablissement Public de Diffusion, dit "Telediffusion de France", Montrouge Cedex, both of France

[21] Appl. No.: 909,027

[22] Filed: Sep. 17, 1986

[30] Foreign Application Priority Data

Sep. 19, 1985 [FR] France ................... 85 13914

[51] Int. Cl.⁴ ...................... H03K 23/48; H03K 23/52
[52] U.S. Cl. ........................ 377/48; 377/117; 377/121
[58] Field of Search ............... 377/47, 48, 115, 117, 377/121

[56] References Cited

U.S. PATENT DOCUMENTS

| | | |
|---|---|---|
| 4,034,302 | 7/1977 | May ........................... 377/48 |
| 4,041,403 | 8/1977 | Chiapparolhi ............... 377/48 |
| 4,390,960 | 6/1983 | Yamashita et al. ......... 377/48 |

Primary Examiner—John S. Heyman
Attorney, Agent, or Firm—Fleit, Jacobson, Cohn & Price

[57] ABSTRACT

The digital circuit is for receiving a master clock signal at a frequency rate f on an input and delivering a rectangular shaped output signal at a lower frequency $(M/N)f$ where M is an integer and N is an even integer greater than M. The circuit comprises an even number N of series connected flip-flops in a ring arrangement, each flip-flop being connected to receive input signals from the preceding flip-flop and from the following flip-flop and to receive a master clock signal on a clock input. The even numbered flip-flops are of a type different from the type of the odd numbered flip-flops. The outputs of the flip-flops each deliver a rectangular pulse signal having a duty ratio equal to $1/N$ of that of the master clock signal. The pulse signals are applied to a combination logic of OR type giving an output signal combining the outputs of said plurality of flip-flops.

9 Claims, 7 Drawing Figures

| Q3 | Q1 | CLOCK | PRESENT STATE | | NEXT STATE | | REMARKS |
|---|---|---|---|---|---|---|---|
| | | | Q2 | $\overline{Q2}$ | Q2 | $\overline{Q2}$ | |
| 0 | 0 | 0 | Q2 | $\overline{Q2}$ | 1 | 1 | FORBIDDEN STATE |
| 0 | 0 | 1 | Q2 | $\overline{Q2}$ | 1 | 0 | RESET TO 1 |
| 0 | 1 | 0 | Q2 | $\overline{Q2}$ | 1 | 0 | RESET TO 1 |
| 0 | 1 | 1 | Q2 | $\overline{Q2}$ | 1 | 0 | RESET TO 1 |
| 1 | 0 | 0 | Q2 | $\overline{Q2}$ | 0 | 1 | RESET TO 0 |
| 1 | 0 | 1 | Q2 | $\overline{Q2}$ | Q2 | $\overline{Q2}$ | UNCHANGED |
| 1 | 1 | 0 | Q2 | $\overline{Q2}$ | Q2 | $\overline{Q2}$ | UNCHANGED |
| 1 | 1 | 1 | Q2 | $\overline{Q2}$ | Q2 | $\overline{Q2}$ | UNCHANGED |

FIG. 5.

| O2 | O0 | CLOCK | PRESENT STATE | | NEXT STATE | | REMARKS |
|----|----|-------|---------------|----|------------|----|---------|
|    |    |       | Q1 | Q̄1 | Q1 | Q̄1 |         |
| 0  | 0  | 0     | Q1 | Q̄1 | Q1 | Q̄1 | UNCHANGED |
| 0  | 0  | 1     | Q1 | Q̄1 | Q1 | Q̄1 | UNCHANGED |
| 0  | 1  | 0     | Q1 | Q̄1 | Q1 | Q̄1 | UNCHANGED |
| 0  | 1  | 1     | Q1 | Q̄1 | 1  | 0  | RESET TO 1 |
| 1  | 0  | 0     | Q1 | Q̄1 | 0  | 1  | RESET TO 0 |
| 1  | 0  | 1     | Q1 | Q̄1 | 0  | 1  | RESET TO 0 |
| 1  | 1  | 0     | Q1 | Q̄1 | 0  | 1  | RESET TO 0 |
| 1  | 1  | 1     | Q1 | Q̄1 | 0  | 0  | FORBIDDEN STATE |

FIG. 6.

DIGITAL CIRCUIT FOR FREQUENCY OR PULSE RATE DIVISION

BACKGROUND OF THE INVENTION

1. Field of the Art

The invention relates to digital circuits for supplying, from a master clock signal, at a frequency or pulse rate f, at least one rectangular signal at a lower frequency (M/N)f, M being an integer and N another integer greater than M and even. It has numerous applications. For instance, it may be used for processing a clock signal at frequency f recovered from a TV signal in accordance with the C-MAC or D2-MAC-Packet standard by filtering the signal and for generating the signal at frequency $(\frac{2}{3})$f required for expanding the compressed data and speech signals in the receiver. It is also suitable for generating, from a master clock at frequency f, successive row and column decoding signals at frequency (M/N)f, offset with respect to each other and without overlap, for example for reading from or writing into a matricial memory.

2. Prior Art

Numerous frequency divider circuits are already known. Most of them use a phase locked loop or PLL. FIG. 1 shows, by way of example, a circuit which supplies frequency 2f/3 and which may be used for generating the 13.5 MHz clock from the 20.25 MHz master clock recovered by a television receiver from a C-MAC or D2-MAC/Packet signal.

The recovered signal at frequency f is applied to a divide-by-three divider 10 whose output is connected to one of the inputs of a phase comparator 12. The error signal delivered by the comparator 12 is subjected to low pass filtering in a filter 14 which delivers a phase error signal. The error signal is applied to a voltage controlled oscillator (VCO) 16. A divide-by-two divider 18 receives the signal from the oscillator 16 and delivers a voltage signal substantially at frequency 2f/3 to the phase comparator 12. The output voltage, at frequency 2f/3, is taken from the output of the oscillator.

Such a phase locked loop circuit has drawbacks. It includes analog components which are expensive, difficult to integrate in LSI circuits further including digital components, sensitive to noise and to temperature variations. The drawbacks are particularly serious in consumer apparatuses such as television sets. The operating range is limited to a restricted frequency band about a set value. The synchronization time during which there is no useful output signal is substantial, particularly at high frequencies and if the operating frequency band is wide.

Pulse rate multipliers using cascaded flip-flops are also well known in the art. Such a multiplier is disclosed in U.S. Pat. No. 3,230,353 (Greene et al). It is not adaptable to delivery of pulses at a rate lower than the input rate for the intended purpose.

SUMMARY OF THE INVENTION

It is an object of the invention to provide a frequency divider circuit which is simple and entirely digital and may be easily integrated in a LSI for generating at least one signal at a frequency (M/N)f lower than that of a master clock at frequency f. It is a more specific object of the invention to provide a circuit capable of operating whatever the frequency, from 0 up to a maximum value which only depends on the intrinsic speed of the circuit components. It is also intended to provide a circuit having a low sensitivity to possible speed differences between its logic components, which may generate fractional frequencies (M being different from 1) as well as several mutually phase shifted signals at frequencies lower than the input frequency.

To this end there is provided a digital circuit comprising an even number N of series connected flip-flops in a ring arrangement, each flip-flop being connected to receive input signals from the preceding flip-flop and from the following flip-flop and to receive a master clock signal on a clock input, the even numbered flip-flops being of a type different from the type of the odd numbered flip-flops and a signal at a frequency lower than the master clock frequency being taken from at least one output of said flip-flops.

In the application of the invention to the generation of a signal at frequency (M/N)f, where M is an integer different from 1 and N is greater than M, the outputs of a plurality of flip-flops, each delivering a rectangular pulse signal having a duty ratio equal to 1/N of that of the master clock signal, are applied to a combination logic of OR type giving an output signal combining the outputs of a plurality of the flip-flops.

The invention will be better understood from the following description of a particular embodiment, given by way of example and which refers to the accompanying drawings.

BRIEF DESCRIPTION OF THE DRAWINGS

FIGS. 5 and 6, respectively, are the tables of truth of the even and uneven flip-flops of FIGS. 3 and 4;

DETAILED DESCRIPTION OF A PREFERRED EMBODIMENT

Figure 2:
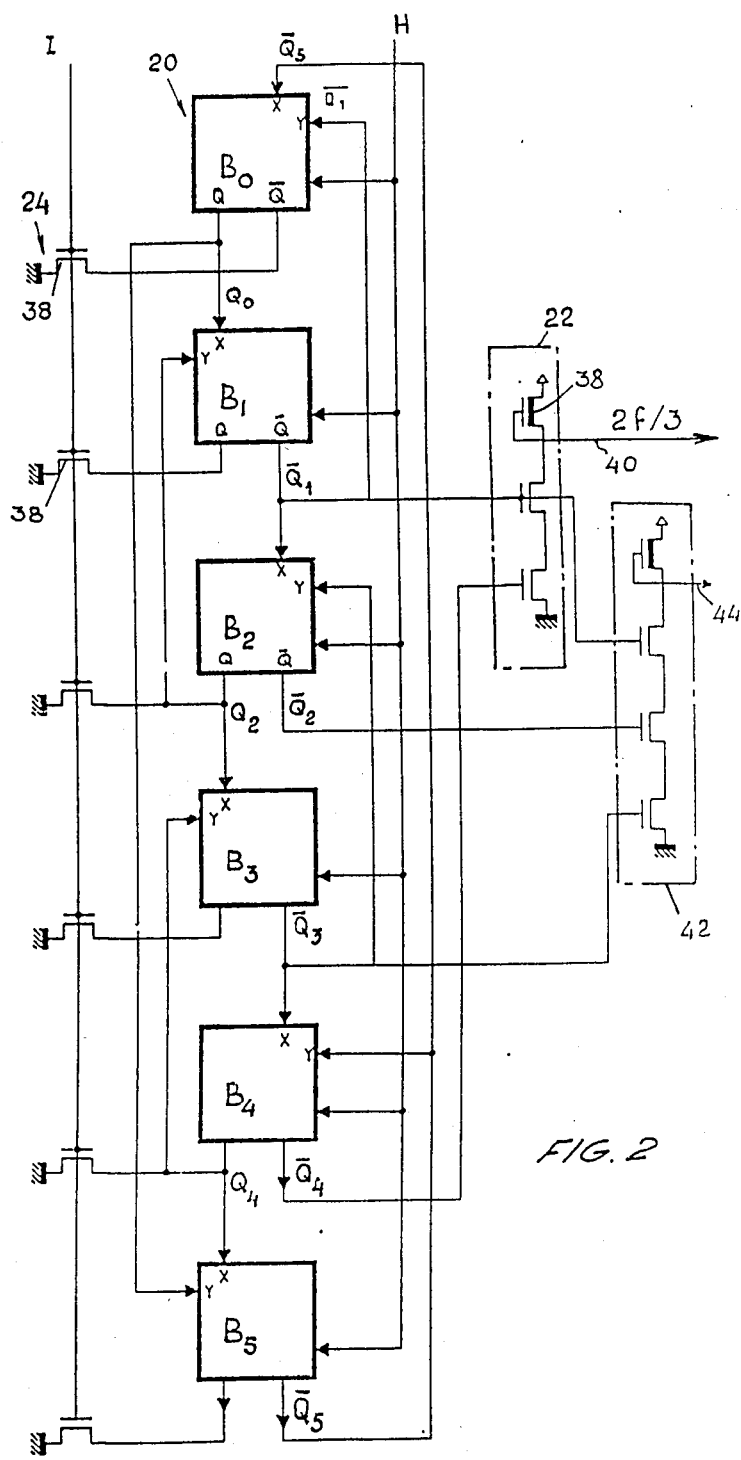
FIG. 2 is a block diagram of a frequency divider circuit according to an embodiment of the invention, providing dividing the rate by 3/2.

The circuit shown in FIG. 2 is intended to provide, from a clock signal H at frequency f delivered by a master clock H (which may be a circuit for recovering a time base from a received TV signal), a signal at frequence 2f/3. It may be regarded as consisting of a sequential system 20 of N=6 series connected flip-flops, a combination logic 22 and a circuit 24 for initialization or reset of the flip-flops.

The six cascaded flip-flops 20 comprise three even numbered flip-flops $B_0$, $B_2$, $B_4$ and three odd numbered flip-flops $B_1$, $B_3$, $B_5$, of a type different from that of the even flip-flops. By alternating two different types of flip-flops, as will be seen, the number of logic layers may be reduced to that required for forming storage points feeding the combination logic and there is no need to generate the logic complement /H of the master clock signal H; the circuit is consequently simplified, the area required on a semi-conductor chip is lowered, the power consumption is decreased and the speed is increased.

Figure 1:
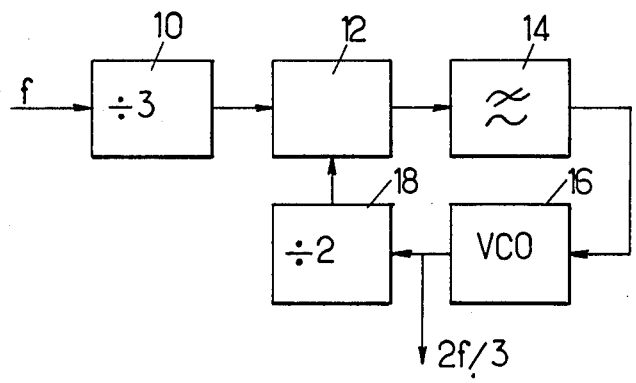
FIG. 1, already mentioned, is a general diagram of a prior art pulse rate divider, having a phase locked loop and changing the pulse rate f to $\frac{2}{3}$ f.
Figure 3:
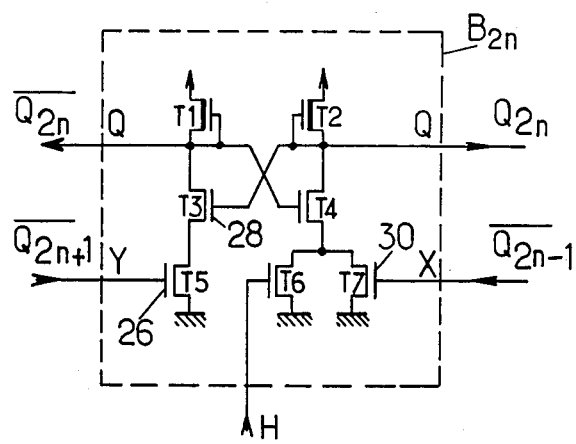
FIGS. 3 and 4 are functional diagrams showing a possible construction of the even and uneven FFs of the circuit of FIG. 2.
Figure 4:
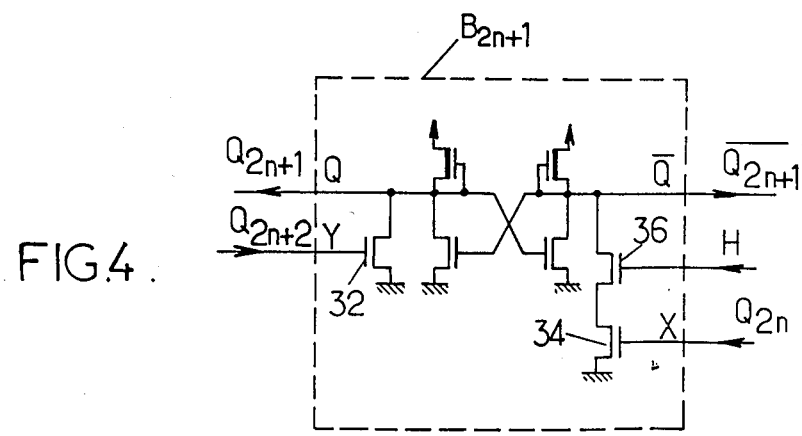

Different flip-flop constructions may be used. The constructions and connections shown in FIGS. 3 and 4 are particularly suitable for use with enrichment and depletion type NMOS transistor circuits. Referring to FIG. 3, an even numbered flip-flop $B_{2n}$ and the corresponding connections are illustrated, with 2n being 0, 2 or 4. FIG. 4 shows an odd numbered flip-flop $B_{2n+1}$, with 2n+1 being 1, 3 or 5. In all cases, the indices shown at the inputs and outputs are to be considered modulo 6.

The flip-flops all have a n-MOS core, formed of four transistors connected two by two in series relation, with two crossed gate-drain couplings. The Q and /Q outputs of a particular flip-flop are taken from the connection between two series connected transistors.

Referring to FIG. 3, the $/Q_{2n}$ output of an even numbered flip-flop $B_{2n}$ is taken from one of the series circuits T3-T1. The first or upstream transistor 28 of that series arrangement is controlled by the /Q output of the next flip-flop, i.e. by output $/Q_{2n+1(modulo\ 6)}$ through a transistor 26. The other series arrangement also consists of two series connected transistors T4-T2. Transistor T4 is controlled by the clock signal (input H) and by the output signal $Q_{2n-1}$ of the preceding flip-flop (input X) through respective transistors 28 and 30: it can be seen that each FF consists of seven transistors T1-T7.

In an odd numbered flip-flop $B_{2n+1}$ (FIG. 4), the control signals are applied to the cross couplings in the FF. The $Q_{2n+2(modulo\ 6)}$ output of the next flip-flop is applied, through a transistor 32, to the input Y corresponding to the junction from which the Q output of flip-flop $B_{2n+1}$ is taken. The H and X inputs of the flip-flop respectively receive the clock signal H and the Q output of flip-flop $B_{2n}$. The H and X control signals are transferred by cascaded transistors 34 and 36 to the junction from which the /Q output of flip-flop $B_{2n+1}$ is taken.

More generally, all types of flip-flops may be used whose tables of truth are as given in FIGS. 5 and 6, respectively. For more clarity, the tables as shown correspond to flip-flops $B_2$ and $B_1$ but they may be directly transposed to the other even and odd numbered flip-flops, since:

for flip-flop $B_1$:
2n+2=2, 2n+1=1, 2n=0
for flip-flop $B_2$:
2n+1=3, 2n=2, 2n-1=1.

The circuit 24 for initialisation of the flip-flops includes a plurality of transistors 38 each assigned to one of flip-flops $B_0, \ldots, B_5$. Each transistor 28 has a grounded source. The transistor gates are driven in parallel by a reset signal I. The drain of the transistor 38 associated with the flip-flop $B_0$ is connected to the Q output of that flip-flop.

The circuit operates as follows, when it receives clock pulses H at frequency f. It is first initialized by applying a signal I at logic level 1 for a time sufficient to "force" the state of all flip-flops. Flip-flop $B_0$ is forced to state 1, i.e. to Q=1 and /Q=0, whereas all other flip-flops are forced to state 0. In other words, Qi=0 and /Qi=1 for all values i other than zero.

After the end of initialization, the first leading edge of a square clock signal (i.e. when signal H increases from 0 to 1, at time $t_0$ in FIG. 7), sets $Q_0$ again to 0 and $Q_1$ to 1. The other outputs $Q_i$ remain at 0 level. The trailing edge of the clock signal is received after a half period T/2 (assuming that the duty cycle is ½). Then the output $Q_1$ is again set to 0 and output $Q_2$ rises to 1. The sequence continues on the following clock pulses and it can be seen in FIG. 7 that the Q outputs of the different flip-flops are set to 1 in sequence annd remain at level 1 for a half clock period. Due to the alternation of two types of FFs, the rise to level 1 takes place alternately on a leading edge and on a trailing edge of the clock signal, without it being necessary to generate signal /H.

When it is desired to obtain a signal at frequency 2f/3, the combination logic 22 consists of a NAND gate which in fact operates as a OR gate. The gate has two N-MOS transistors whose gates respectively receive the $/Q_1$ and $/Q_4$ outputs and which are connected in series mutually and with an output transistor 39 of N or P type, depending on whether the other transistors are of P or N type. The signal at frequency 2f/3 appears at output 40 (line 40 in FIG. 7), with a duty ratio equal to ⅓.

Other circuits would deliver other frequencies. Referring to FIG. 2, a signal at frequency f/3 with a duty ratio equal to ½ may be obtained with a logic 42 again consisting of a NAND gate circuit. The gates of three cascaded transistors of gate circuit 42 respectively receive outputs $/Q_1$, $/Q_2$ and $/Q_3$. The signal at frequency f/3 appears at the output 44 of the logic.

Figure 7:
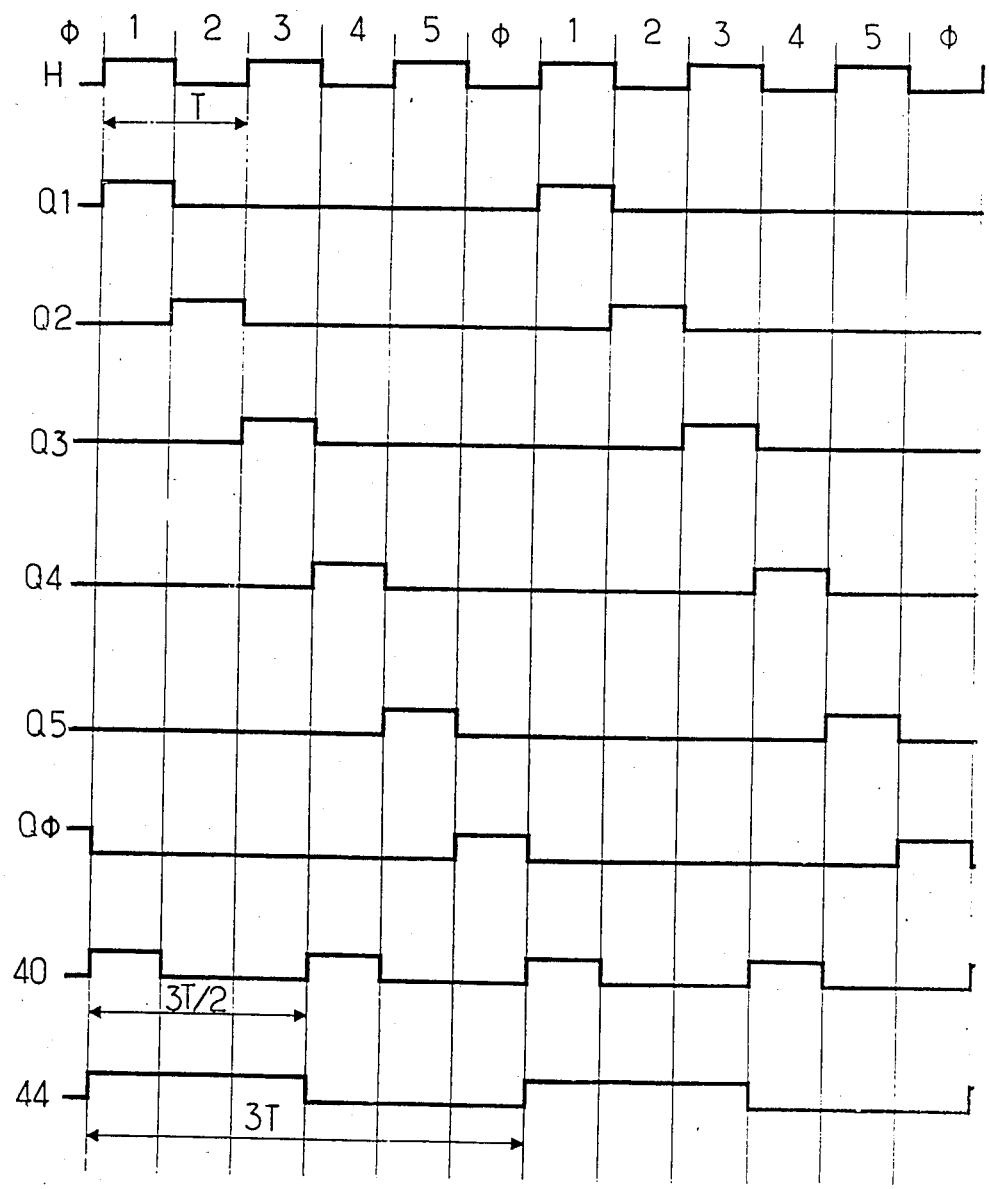
FIG. 7 is a timing diagram of the circuit of FIG. 2.

Referring to the timing diagram of FIG. 7, it can be seen that signals are obtained from the Q outputs of the six successive flip-flops which consist of time adjacent rectangular signals each having a duty ratio equal to 1/6 with the pulses appearing in sequence without overlap. The successive signals may be used for decoding addresses sequentially: addresses n, then n+2, then n+4, etc. may be successively written into or read from a memory. Thus a FIFO memory (first in-first out) circuit may be controlled in a simple way. It is sufficient to use only the Q outputs of the odd numbered flip-flops to have time intervals each equal to the duration of a control pulse between successive pulses. Thus it may be guaranted that there will only be a single active decoding signal per line or/and per column and writing (or reading) errors may be avoided.

I claim:

1. Digital circuit for receiving a master clock signal at a frequency rate f on an input and delivering a rectangular shaped output signal at a lower frequency (M/N)f where M is an integer and N is an even integer greater than M, comprising an even number N of series connected flip-flops in a ring arrangement, each flip-flop being connected to receive input signals from the preceding flip-flop and from the following flip-flop and to receive a master clock signal on a clock input, the even numbered flip-flops being of a type different from the type of the odd numbered flip-flops and a signal at a frequency lower than the master clock frequency being taken from at least one output of said flip-flops.

2. Digital circuit according to claim 1 for delivering an output signal at frequency (M/N)f where M is an integer different from 1, wherein the outputs of a plurality of said flip-flops each delivering a rectangular pulse signal having a duty ratio equal to 1/N of that of the master clock signal, are applied to a combination logic of OR type giving an output signal combining the outputs of said plurality of flip-flops.

3. Digital circuit according to claim 2 for generating a frequency 2f/3, wherein said series connected flip-flops consist of six flip-flops and wherein said combination logic comprises a NAND gate having two inputs respectively connected to the /Q outputs of two of said flip-flops numbered i and i+3(modulo 6), where i is any number between 0 and 5.

4. Digital circuit according to claim 1 for generating a plurality of successive signals for addressing rows and columns in a matrix, said signals being mutually offset and without overlap, wherein said addressing signals are obtained on corresponding outputs of one of said flip-flops out of two.

5. Digital circuit according to claim 1 further comprising a self initialization circuit for simultaneously forcing the Q output of one of said flip-flops to one and the Q outputs of all other flip-flops to one.

6. Digital circuit according to claim 1, wherein all said flip-flops comprise transistors all of which are of N-MOS type.

7. Digital circuit according to claim 6, wherein each of said flip-flops has a core consisting of two pairs of two N-MOS transistors, the transistors in each pair being in series relation and a coupling connection being provided between the gate of the first transistor in each pair and the drain of the second transistor in the other pair, wherein in the even numbered flip-flops the first transistor of the series connection from which the /Q output is taken has a control connection from the /Q output of the following flip-flop while, in the odd numbered flip-flops, the junction from which the Q output of the flip-flop is taken receives the Q output of the next flip-flop.

8. Digital circuit according to claim 7, wherein, in each even numbered flip-flop, the first transistor of the series connection from which the Q output is taken is controlled by the master clock signal and by the Q output of the preceding flip-flop through respective transistors.

9. Digital circuit according to claim 7, wherein, in each odd numbered flip-flop, the input corresponding to the /Q output of the flip-flop receives the clock signal and the output of the preceding flip-flop through cascaded transistors.

* * * * *